(12) United States Patent
Choder

(10) Patent No.: US 6,593,896 B2
(45) Date of Patent: Jul. 15, 2003

(54) FIELD PROBE

(75) Inventor: Jerome Choder, Huntington Valley, PA (US)

(73) Assignee: Amplifier Research Corporation, Souderton, PA (US)

(*) Notice: Subject to any disclaimer, the term of this patent is extended or adjusted under 35 U.S.C. 154(b) by 0 days.

(21) Appl. No.: 09/968,816

(22) Filed: Oct. 1, 2001

(65) Prior Publication Data

US 2003/0063039 A1 Apr. 3, 2003

(51) Int. Cl.[7] .............................................. G01R 31/02
(52) U.S. Cl. .......................................... 343/802; 324/72
(58) Field of Search ................................. 343/802, 725, 343/826, 895, 700 MS, 760; 324/72

(56) References Cited

U.S. PATENT DOCUMENTS

| | | | | |
|---|---|---|---|---|
| 3,662,260 A | | 5/1972 | Thomas et al. ................. 324/72 |
| 3,750,017 A | * | 7/1973 | Bowman et al. ............... 324/72 |
| 3,906,509 A | * | 9/1975 | DuHamel ..................... 343/895 |
| 5,644,321 A | | 7/1997 | Benham ....................... 343/826 |
| 6,061,025 A | * | 5/2000 | Jackson et al. ......... 343/700 MS |
| 6,084,551 A | | 7/2000 | Aslan ......................... 343/725 |
| 6,239,749 B1 | * | 5/2001 | Tzuang et al. ......... 343/700 MS |
| 6,396,460 B2 | * | 5/2002 | Tseng et al. ................. 343/895 |

OTHER PUBLICATIONS

Motohisa Kanda, Standard Antennas for Electromagnetic Interference Measurements and Methods to Calibrate Them, pp. 261–273, IEEE Transactions on Electromagnetic Compatibility, vol. 36, No. 4, Nov. 1994.

* cited by examiner

*Primary Examiner*—James Clinger
(74) *Attorney, Agent, or Firm*—Howson & Howson

(57) ABSTRACT

An E-field probe comprises one or more dipoles, each comprising plural, parallel, strings of discrete resistors mounted on a section of printed circuit board and connected electrically so that the parallel strings are twisted about each other for optimum orientation symmetry and minimum stray field pick-up. The values of the individual resistors are chosen so that the dipole is essentially a tapered resistance dipole, providing good performance over a very broad range of frequencies. A pair of diodes connected respectively in parallel strings of one arm of the dipole allows the feeder to be constituted by a pair of parallel series of resistors of comparatively high resistance value continuing from the outer end of the arm in which the diodes are situated. The dipole is effectively "end fed" rather then center fed, and pattern distortion and axial asymmetry are minimized.

34 Claims, 5 Drawing Sheets

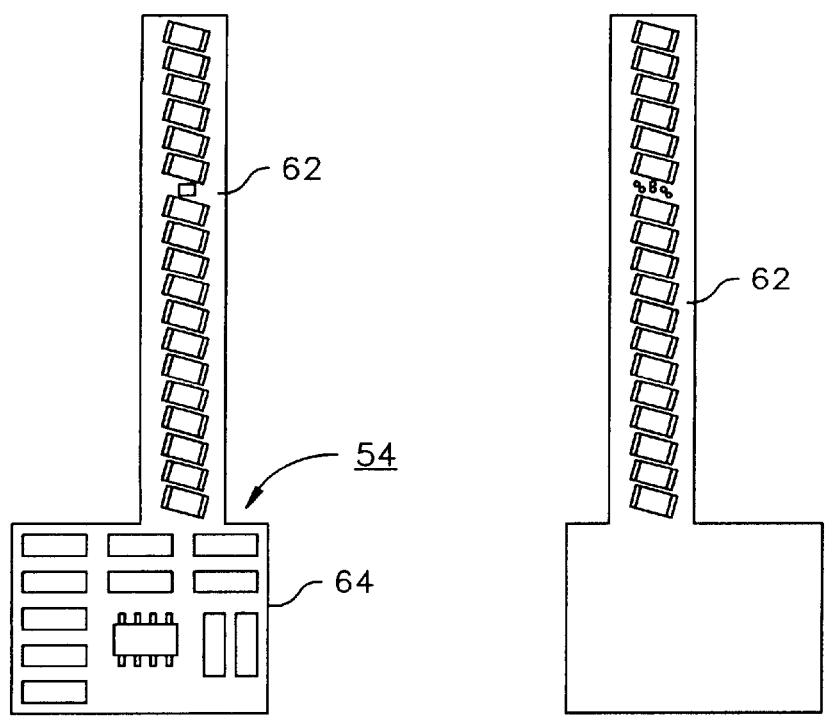
*Fig. 3*          *Fig. 4*
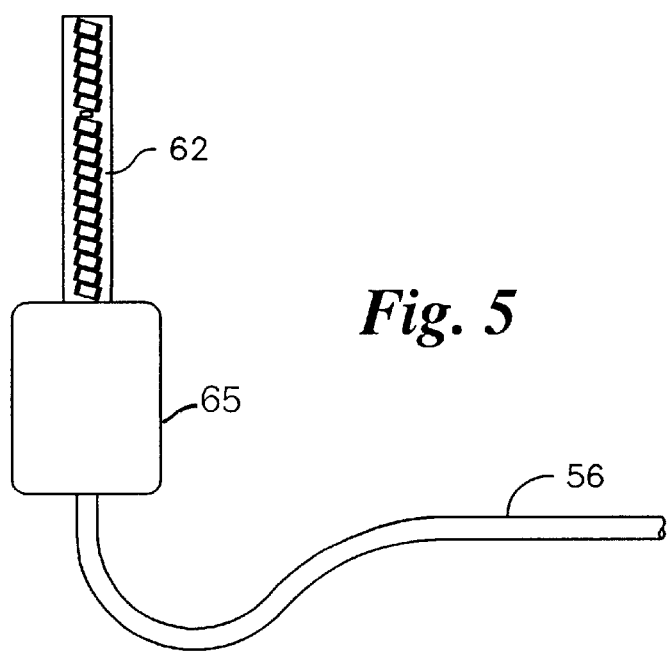
*Fig. 5*

FIELD PROBE

FIELD OF THE INVENTION

This invention relates generally to radio antennas, and more particularly to improvements in a special form of antenna, known as a field probe. A field probe is used for measuring the strength of a radio frequency field. Field probes are particularly useful in the calibration of electromagnetic susceptibility testing equipment, in which an electronic device under test is exposed to a strong electromagnetic field swept through a range of frequencies. The invention relates specifically to improvements in E-field probes.

BACKGROUND OF THE INVENTION

An E-field probe for electromagnetic susceptibility testing generally comprises one or more short antennas mounted on a housing containing processing circuitry. To minimize distortion of the antenna pattern resulting from the presence of conductive feeder cables, the processing circuitry typically includes a transducer which converts a detected r.f. voltage to a modulated light beam, which is then conducted away from the probe through a fiber optic cable. A fiber optic cable may also be used to deliver D.C. operating power to the processing circuitry in the form of a laser beam.

An E-field probe is typically in the form of single axis probes or a three axis probe. In either case, it preferably utilizes one or more dipole antennas. Even though fiber optic light conductors are used to minimize distortion, for most probes, especially those operable over a range of frequencies including frequencies in the gigaHertz region, it is not practical to position the processing circuitry at the dipole center. Accordingly the conventional practice has been to connect a conductive feeder, i.e., a transmission line from the processing circuitry to the dipole center (or, in the case of a multi-axis probe, to the dipole centers). The feeder itself causes distortion of the antenna pattern. In conventional practice, the distortion caused by the transmission line is reduced by using a high resistance feeder.

Conventional E-field probes also tend be highly frequency dependent in practice, and require compensation in their associated electronic circuitry in order to be useful over a broad frequency range. In addition, conventional E-field probes, tend to exhibit asymmetry in their antenna patterns. Asymmetry exists with respect to an imaginary plane to which the dipole elements are perpendicular (orientation asymmetry) and with respect to arbitrarily selected imaginary planes in which the dipole elements lie (axial asymmetry).

Still another drawback of conventional E-field probes is their tendency to be affected by stray fields, including magnetic fields.

SUMMARY OF THE INVENTION

An important object of this invention, therefore, is to avoid one or more of the aforementioned drawbacks of conventional probes.

Briefly, the preferred E-field probe in accordance with the invention, comprises one or more dipoles, each comprising plural, parallel, strings of discrete resistors mounted on a section of printed circuit board and connected electrically so that the parallel strings are twisted about each other for optimum orientation symmetry and minimum stray field pick-up. The values of the individual resistors are chosen so that the dipole is essentially a tapered resistance dipole, providing good performance over a very broad range of frequencies.

A particularly desirable feature of the invention is the provision of a pair of diodes connected respectively in parallel strings of one arm of the dipole, but connected electrically to each other in the same direction, i.e., having a direct connection between the anode of one of the diodes and the cathode of the other diode. This arrangement of diodes allows the feeder to be constituted by a pair of parallel series of resistors of comparatively high resistance value continuing from the outer end of the arm in which the diodes are situated. In this way, the dipole is effectively "end fed" rather then center fed, and pattern distortion and axial asymmetry are minimized.

In accordance with one aspect of the invention, the field probe comprises at least one elongated element at least part of the length of which is composed of a plurality of closely coupled conductors, preferably two, disposed in substantially parallel, side-by-side relation to one another. As used herein, the term "closely coupled" with reference to parallel conductors means that the conductors are all situated within a cross-sectional area transverse to their direction of elongation, the largest dimension of which is much less than, i.e., not more than about one twentieth of, one wavelength at the highest frequency of intended operation. The highest frequency of intended operation is the maximum frequency where the antenna pattern (both in the E and H planes) has not significantly deviated from the pattern of an electrically short dipole. The term "parallel, side-by side relation," when used with reference to conductors (including resistor strings) means that the conductors are not only parallel, but also that each end of one conductor is located adjacent an end of each other conductor.

In a practical electrically short probe, the conductors may be considered closely coupled when the maximum dimension of a transverse cross-section containing the conductors is within the range of approximately 0–15% of the length of the dipole portion of the probe. For a probe having a highest frequency of intended operation of 4.2 GHz, the largest dimension of the cross-sectional area in which the parallel conductors are located should be about 3.5 mm.

The elongated element is preferably a dipole antenna composed of two conductive elements, i.e., arms, extending in opposite directions from a dipole center at an intermediate location. At least one of the conductive elements is constituted by said part of the length of said at least one elongated element and comprises two closely coupled conductors disposed in substantially parallel, side-by-side relation to each other. These conductors extend from the intermediate location to an end location. Two terminals are provided at the end location, one terminal being at an end of one of the two closely coupled conductors and the other terminal being at an adjacent end of the other of the two closely coupled conductors. The probe includes processing circuitry and a transmission line having first and second opposite ends. The first end of the transmission line is connected to the processing circuitry, and the second end of the transmission line is connected directly to the dipole antenna at the terminals. The two closely coupled conductors are connected to each other at the intermediate location by a pair of diodes having a connection joining the diodes in series in the same direction electrically, and the other of the conductive elements is directly joined to said connection.

In a preferred embodiment, the conductors are resistive elements. Preferably, each resistance consists of plural discrete resistors connected in series. The discrete resistors preferably increase progressively in resistance with distance from the intermediate location on the dipole. In the case of two closely coupled resistances, the resistances are preferably twisted about each other.

If each of the closely coupled resistances is composed of two series of discrete resistors, the twisting of the resistances about each other is preferably achieved by situating alternate resistors of each series on opposite faces of a printed circuit board. The resistors on each side of the printed circuit board are disposed in a column parallel to the direction of elongation of said elongated dipole element, with the pairs of terminals of the resistors on each side of the printed circuit board situated in parallel lines in oblique relation to the direction of elongation of the elongated element. The resistors of each series may then be connected to one another by substantially straight conductors extending through the printed circuit board in perpendicular relation to the faces of the printed circuit board.

As will appear from the following detailed description, the invention provides an E-field probe having one or more of the following desirable characteristics: low antenna pattern distortion, a high degree of frequency independence, good symmetry, and stray field immunity.

Various other objects, details and advantages of the invention will be apparent from the following detailed description when read in conjunction with the drawings.

BRIEF DESCRIPTION OF THE DRAWINGS

FIG. 3 is a front elevational view showing the twisted, discrete resistor, tapered resistance element, including the printed circuit board on which the resistors of the element and associated processing circuitry are mounted;

FIG. 4 is a rear elevational view of the device of FIG. 3;

FIG. 5 is an elevational view of a single element probe incorporating a twisted, discrete resistor, tapered resistance element;

DETAILED DESCRIPTION OF THE PREFERRED EMBODIMENT

Figure 1:
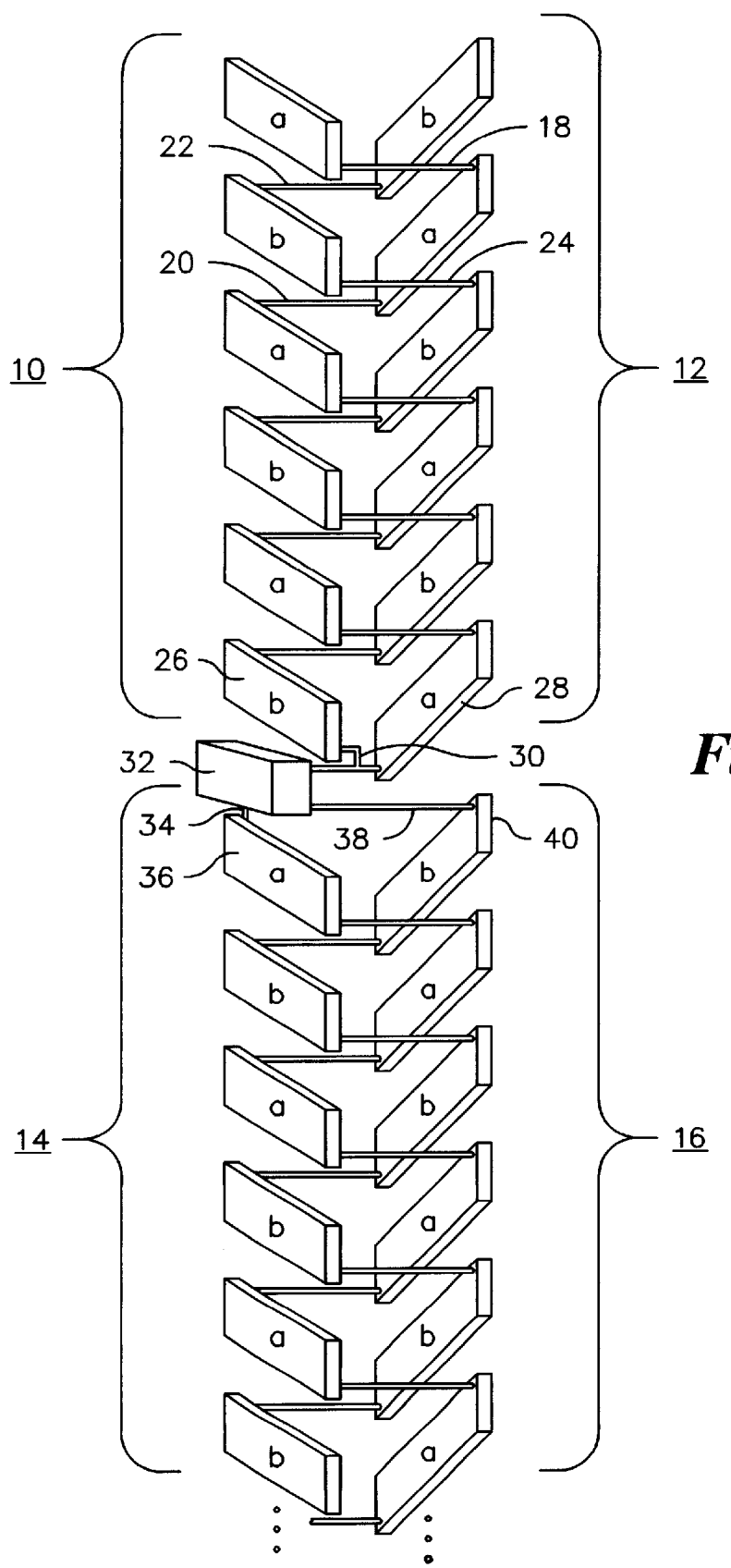
FIG. 1 is a schematic diagram illustrating the mechanical configuration of a typical twisted, discrete resistor, tapered resistance element in accordance with the invention.

The mechanical configuration of a typical field probe element is shown in FIG. 1. The field probe element comprises four sets, 10, 12, 14 and 16 of chip resistors. The chip resistors are mounted on a printed circuit board, which is not shown in FIG. 1. Sets 10 and 14 are mounted on one side of the circuit board, while sets 12 and 16 are mounted on the opposite side of the circuit board.

The resistors are connected electrically by conductors shown as wires in FIG. 1. Chip resistors "a" in sets 10 and 12 in the upper part of FIG. 1 are connected electrically in series by conductors 18, 20, etc. while chip resistors "b" in sets 10 and 12 are connected electrically series by conductors 22, 24, etc. The chips on one side of the board are tilted obliquely in one direction and the chips on the opposite side of the board are tilted obliquely in the opposite direction.

The tilting of the chips enables the lowermost corner of each resistor to be located directly opposite the uppermost corner of the next resistor in each electrically connected series. With this opposed relationship between the corners of the resistors in the electrically connected series, the conductors can extend directly through the printed circuit board so that, in practice the conductors can be in the form of plated-through holes in the board.

It will be apparent from FIG. 1 that the two series of resistors "a" and "b" are twisted about each other, forming a resistive twisted pair.

Resistor sets 14 and 16 are similarly composed of a series of resistors "a" and a series of resistors "b" with electrical connections made through the circuit board in such a way that the series of resistors "a" and "b" are twisted about each other.

As seen in the middle portion of FIG. 1, resistor chip 26, which is a "b" chip, is connected directly to resistor chip 28, which is an "a" chip. by a conductor 30, which is also connected to a common terminal of an integrated dual diode package 32. The cathode of one of the diodes is connected through conductor 34 on the circuit board to and "a" resistor 36, of set 14 and the anode of the other diode is connected through conductor 38 to a "b" resistor 40 of set 16.

Figure 2:
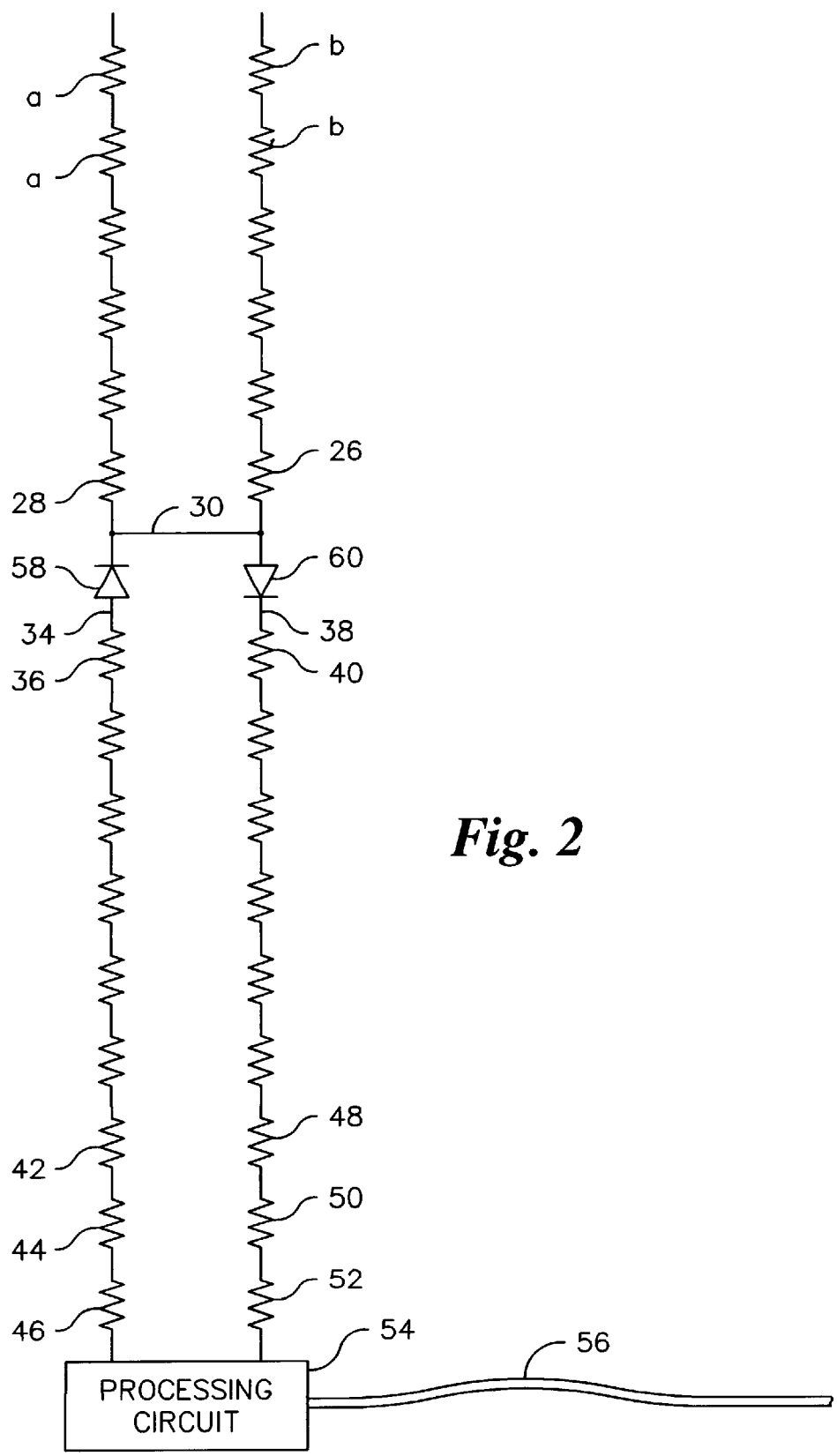
FIG. 2 is an electrical schematic of the same element.

The electrical configuration of the resistors, and the diodes, are shown in FIG. 2. In effect, the resistors above the interconnection 30 constitute one arm of a dipole, while some of the resistors below the diodes constitute the other arm of the dipole. Several resistors remote from the diodes, i.e., resistors 42–52, serve as a twisted feeder, connecting the dipole antenna to a processing circuit 54, which is preferably converts the received radio signal to an optical signal carried by a flexible fiber optic light conductor 56. The fiber optic light conductor is not electrically conductive, and therefore has little influence on the antenna pattern of the probe.

The resistance values of the discrete resistors constituting the dipole preferably vary to cause the total antenna to approximate a tapered resistance dipole over its operating frequency range, the resistance increasing with distance from the center of the dipole at the location of the diodes. A tapered resistance dipole is described in Kanda, M. *Standard Antennas for Electromagnetic Interference Measurements and Methods to Calibrate Them,* IEEE Transactions on Electromagnetic Compatibility, Vol. 36, No. 4, November 1994. The Kanda paper is here incorporated by reference.

By way of example, typical values of resistors 26, 28, 36 and 40 are 68 Ω. The values of the six resistors in each series are typically 68 Ω, 82 Ω, 100 Ω, 150 Ω, 270 Ω and 560 Ω, respectively, progressing from the center of the dipole toward the tips. These values are for a probe designed to have a highest operating frequency between about 4 and 5 GHz. The dimensions of each dipole, and the values of the resistors, may be varied, depending on the intended upper frequency limit of the probe.

The tapered resistive loading, achieved by forming the dipole elements out of resistors having resistance values progressing from a low value to a higher value proceeding outward from the center of the dipole provides the probe with a broad band frequency response and suppresses the effect of the natural resonant frequency of the antenna. The use of closely coupled, plural strings of resistors to make up each element simulates the effect of a relatively thick dipole element, further improving the sensitivity of the probe.

The feeder resistors 42–52 should have much higher values, resistors 42 and 48 each typically having a resistance of 2 MΩ, and resistors 44, 50, 46 and 52, each typically having a value of 390 KΩ.

Mounting of the resistors on opposite sides of a circuit board makes it possible to twist the resistor strings about each other as shown in FIG. 1. The resistor strings forming the feeder are twisted about each other in the same manner as the resistor strings forming the dipole elements. Twisting of the resistor strings of the feeder reduces pick-up of extraneous fields, and twisting of the resistor strings forming the dipole elements improves the rotational symmetry of the dipole about its longitudinal axis. While it is important that the dipole element adjacent the feeder be composed of two or more strings of resistors, the dipole element remote from the feeder, of course, can be composed of a single string of resistors. However, both dipole elements are preferably formed of identical twisted resistor strings for symmetry.

Other variations on the number of resistor strings in each arm of the dipole are possible. For example, if four diodes are provided in series (connected electrically in the same direction) at the center of the dipole, the processing circuit can be connected through two parallel resistor strings of a first dipole arm to the outer ends of the series of diodes, a third resistor string, connected at one end to the connection of the second and third diodes, and with its other end free, can constitute a third string in the first dipole arm. The other dipole arm can comprise two parallel resistor strings connected respectively to the connection between the first and second diodes and the connection between the third and fourth diodes. Thus, in this variation, the dipole would have three resistor strings in one arm, and two resistor strings in its other arm.

An important feature of the preferred embodiment of the invention is the provision of the pair of diodes, 58 and 60, at the center of the dipole. These diodes are connected electrically in the same direction in series with each other, and are located respectively in series with the resistor strings which form the dipole element adjacent the feeder. The diodes act together as a detector, providing a DC output to the processing circuit 54, which varies in accordance with the magnitude of the E field to which the dipole is exposed.

In the case of a resistive dipole having a single diode at its center as a detector, with a two-conductor feed line carrying a DC signal away from the diode, a 180° reversal of the dipole will produce a different response to a given field unless the diode is operating in its square law region.

As shown in FIG. 2, the diodes of the preferred embodiment of the invention are effectively connected in series with each other, but are disposed in opposite directions in the resistive elements with which they are in series. As a result of the opposite directions of the two diodes, a symmetry is achieved which allows the detected responses to a given E-field to be identical when the dipole orientation is reversed, i.e., the dipole of FIGS. 1 and 2 is turned upside down through 180°, even if the diodes are operating outside their square law region.

The centrally located diode pair has the additional advantage that it allows the feeder to be connected to one of the outer ends of the dipole, thereby obviating a separate feeder connected to the center of the dipole, and eliminating adverse effects of a separate feeder on the axial symmetry of the dipole's antenna pattern. The centrally located diode pair also has a potential advantage in providing an increased response at low frequencies, which can be advantageous in some applications.

As mentioned previously, the mounting of the discrete resistors of the dipole and its feeder on a circuit board provides a convenient way to provide a dipole comprising twisted pairs of closely coupled resistive conductors. It also allows the processing circuitry and the dipole and feeder resistors to be mounted on a single circuit board, as shown in FIGS. 3 and 4. The circuit board can be formed with an elongated, narrow portion 62 extending outwardly from an edge of a broader portion 64 on which the various components of the processing circuit may be mounted, as shown in FIG. 3. In a typical probe, the processing circuit will include amplification and compression circuitry and a converter to translate the DC response of the dipole to an optical signal for delivery through fiber optic light conductor 56 (FIG. 2) to an analog-to-digital converter (not shown) for translating the signal to a format in which it can be utilized in a computer.

The processing circuit can be powered in any of several ways. For example, it can carry its own battery power supply, or derive power from an on-board generating photocell energized by a beam transmitted through the light conductor toward the processing circuit from an external laser or other light source.

In the case of a single axis probe, the processing circuit can be contained within a housing 65, as shown in FIG. 5.

Plural probes can be incorporated into a unit to provide a probe comprising three mutually orthogonal dipoles for E-field measurements in three axes.

Figure 6:
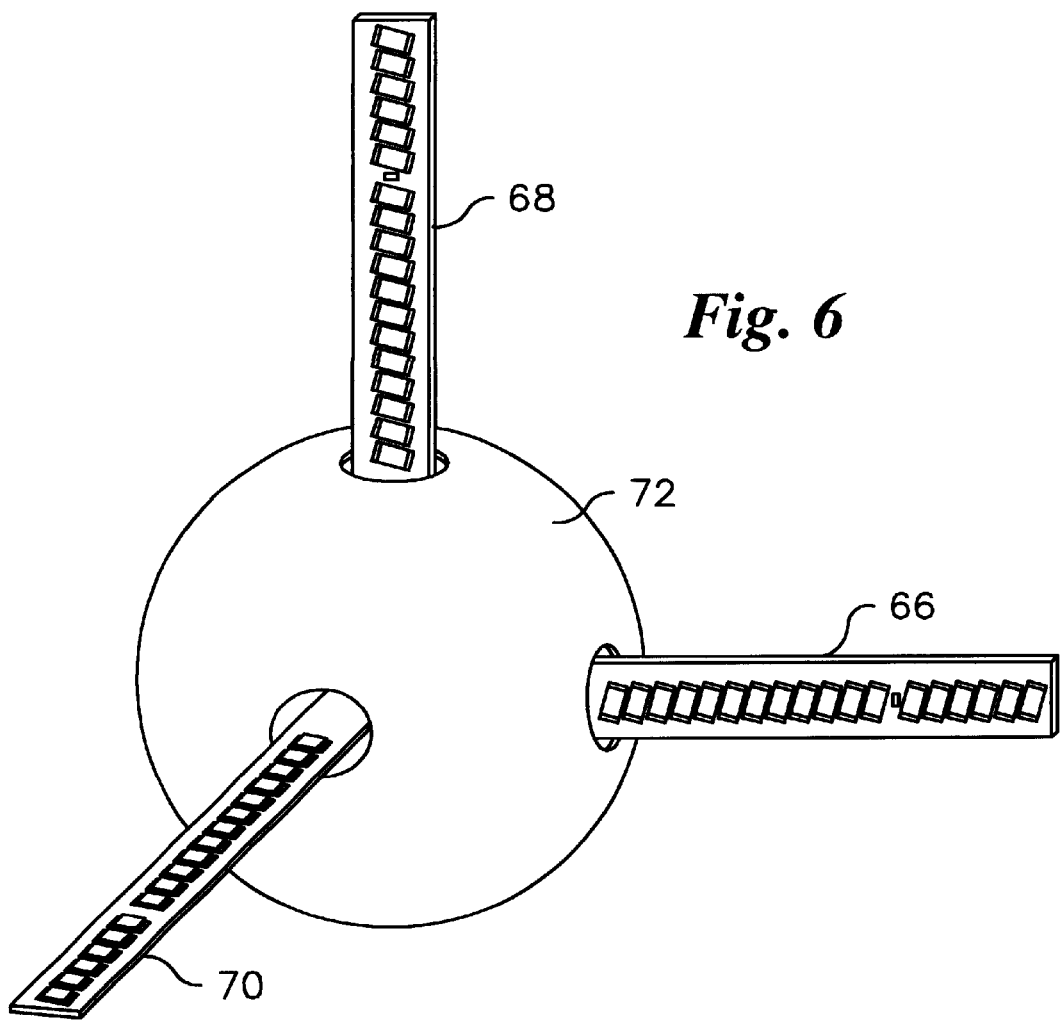
FIG. 6 is a perspective view of a three element probe incorporating three, mutually orthogonal twisted, discrete resistor, tapered resistance elements.

One such unit is depicted in FIG. 6, in which dipoles 66, 68 and 70 extend respectively along x, y and z axes from a spherical housing 72, which contains processing circuitry. Dipoles 66 and 68 can be formed on a single printed circuit board.

Figure 7:
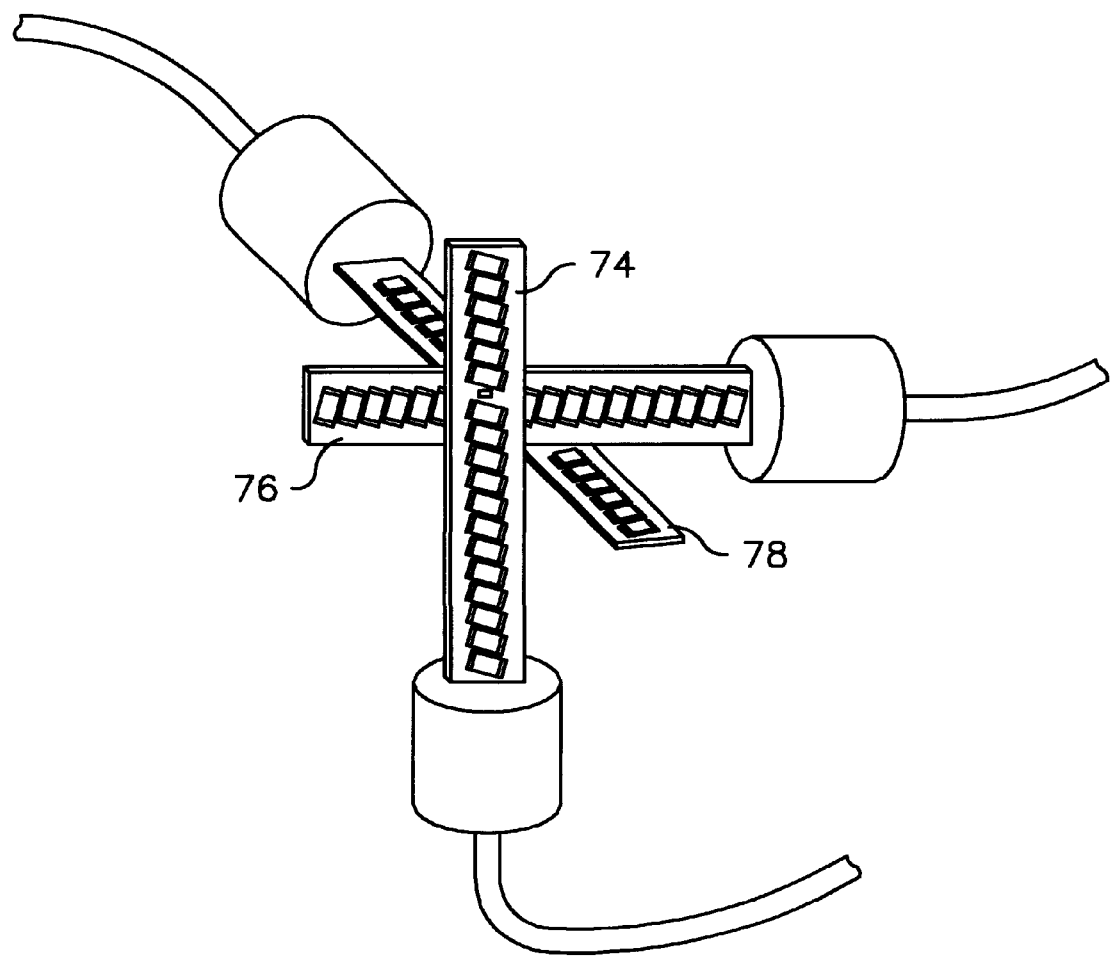
FIG. 7 is a perspective view of an alternative version of the three element probe.

Another three-dimensional E-field probe, shown in FIG. 7, comprises three separate probes 74, 76 and 78, of the type shown in FIG. 5, disposed in mutually orthogonal relationship, crossing one another approximately at the dipole centers.

Various modifications can be made to the probes described. For example, the number of discrete resistors making up each dipole can vary, as can the number of discrete resistors making up the feeders. If the processing circuitry is small, the number of feeder resistors can be reduced, or the feeders can be eliminated altogether.

Advantage can be taken of certain features of the invention, for example the twisted, discrete resistor dipole arms, without connecting a feeder to the outer end of a dipole arm. For example, if the processing circuit is made small, it is possible and locate the processing circuit close to the dipole center rather than at an end of a dipole arm. Moreover, if a very small processing circuit is used, it can be provided on the circuit board at the location of the dipole center.

Still other modifications may be made to the apparatus and method described above without departing from the scope of the invention as defined in the following claims.

I claim:

1. A field probe comprising at least one elongated element at least part of the length of which comprises two closely coupled conductors extending, in substantially parallel, side-by-side relation to each other, in the direction of elongation of said elongated element, a pair of feed conductors connected respectively to said closely coupled conductors, said closely coupled conductors being sufficiently isolated from each other to be capable of a D.C. potential difference between them, and means, connecting said closely coupled conductors to each other, for converting an r.f. current induced in said probe, by a field in which the probe is situated, to a direct current in said feed conductors.

2. A field probe according to claim 1, in which said feed conductors are connected to said closely coupled conductors at a location remote from the location at which said connecting and converting means connects said conductors to each other.

3. A field probe comprising at least one elongated element at least part of the length of which is composed of a plurality of closely coupled conductors disposed in substantially parallel, side-by-side relation to one another, in which the elongated element is a dipole antenna composed of two conductive elements extending in opposite directions from a dipole center at an intermediate location on the elongated element, in which at least one of said conductive elements is constituted by said part of the length of said at least one elongated element and comprises two closely coupled conductors disposed in substantially parallel, side-by-side relation to each other and extending from said intermediate location to an end location whereby two terminals are provided at said end location, one said terminal being at an end of one of said conductors and the other said terminal being at an adjacent end of the other of said conductors, and including processing circuitry and a transmission line having first and second opposite ends, the first end of the transmission line being connected to the processing circuitry and the second end of the transmission line being connected directly to said dipole antenna at said terminals, and in which the two closely coupled conductors are connected to each other at said intermediate location by a pair of diodes having a connection joining the diodes in series, and the other of said conductive elements is directly joined to said connection.

4. A field probe comprising at least one elongated element at least part of the length of which is composed of a plurality of closely coupled conductors disposed in substantially parallel, side-by-side relation to one another, in which the elongated element is a dipole antenna composed of two resistive elements extending in opposite directions from a dipole center at an intermediate location on the elongated element, in which at least one of said resistive elements is constituted by said part of the length of said at least one elongated element and comprises two closely coupled resistances disposed in substantially parallel, side-by-side relation to each other and extending from said intermediate location to an end location whereby two terminals are provided at said end location, one said terminal being at an end of one of said resistances and the other said terminal being at an adjacent end of the other of said resistances, and including processing circuitry and a transmission line having first and second opposite ends, the first end of the transmission line being connected to the processing circuitry and the second end of the transmission line being connected directly to said dipole antenna at said terminals, and in which the two closely coupled resistances are connected to each other at said intermediate location by a pair of diodes having a connection joining the diodes in series, and the other of said conductive elements is directly joined to said connection.

5. A field probe comprising at least one elongated element at least part of the length of which is composed of a plurality of closely coupled conductors disposed in substantially parallel, side-by-side relation to one another, in which the elongated element is a dipole antenna composed of two resistive elements extending in opposite directions from a dipole center at an intermediate location on the elongated element, in which at least one of said resistive elements is constituted by said part of the length of said at least one elongated element and comprises two closely coupled resistances disposed in substantially parallel, side-by-side relation to each other, each said resistance consisting consists of plural discrete resistors connected in series, said one elongated element extending from said intermediate location to an end location whereby two terminals are provided at said end location, one said terminal being at an end of one of said resistances and the other said terminal being at an adjacent end of the other of said resistances, and including processing circuitry and a transmission line having first and second opposite ends, the first end of the transmission line being connected to the processing circuitry and the second end of the transmission line being connected directly to said dipole antenna at said terminals, and in which the two closely coupled resistances are connected to each other at said intermediate location by a pair of diodes having a connection joining the diodes in series, and the other of said conductive elements is directly joined to said connection.

6. A field probe according to claim 5, in which the resistances of the resistors progressively increase with distance from said intermediate location.

7. A field probe according to claim 5, in which the two closely coupled resistances are twisted about each other.

8. A field probe according to claim 5, in which the resistors of both resistances are mounted on a single printed circuit board, and in which the two closely coupled resistances are twisted about each other and alternate resistors of each series are situated on opposite faces of the circuit board.

9. A field probe according to claim 5, in which the resistors of both resistances are mounted on a single printed circuit board, in which the two closely coupled resistances are twisted about each other and alternate resistors of each series are situated on opposite faces of the printed circuit board, in which each resistor has a pair of terminals spaced from each other, and in which the resistors on each side of the printed circuit board are disposed in a column parallel to the direction of elongation of said elongated element, with the pairs of terminals of the resistors on each side of the printed circuit board situated in parallel lines in oblique relation to the direction of elongation of the elongated element, the resistors of each series being connected to one another by substantially straight conductors extending through the printed circuit board in perpendicular relation to the faces of the printed circuit board.

10. A field probe comprising at least one elongated element at least part of the length of which is composed of a plurality of closely coupled conductors disposed in substantially parallel, side-by-side relation to one another, in which the elongated element is a dipole antenna composed of two resistive elements extending in opposite directions from a dipole center at an intermediate location on the elongated element, in which at least one of said resistive elements is constituted by said part of the length of said at least one elongated element and comprises two closely coupled resistances disposed in substantially parallel, side-by-side relation to each other, each said resistance consisting of plural discrete resistors connected in series, the resistors of both resistances are mounted on a single printed circuit board, said one elongated element extending from said intermediate location to an end location whereby two terminals are provided at said end location, one said terminal being at an end of one of said resistances and the other said terminal being at an adjacent end of the other of said resistances, and including processing circuitry and a transmission line having first and second opposite ends, the first end of the transmission line being connected to the processing circuitry and the second end of the transmission line being connected directly to said dipole antenna at said terminals, and in which the two closely coupled resistances are twisted about each other and alternate resistors of each series are situated on opposite faces of the printed circuit board.

11. A field probe according to claim 10, in which each resistor has a pair of terminals spaced from each other, and in which the resistors on each side of the printed circuit board are disposed in a column parallel to the direction of elongation of said elongated element, with the pairs of terminals of the resistors on each side of the printed circuit board situated in parallel lines in oblique relation to the direction of elongation of the elongated element, the resistors of each series being connected to one another by substantially straight conductors extending through the printed circuit board in perpendicular relation to the faces of the printed circuit board.

12. A field probe comprising at least one elongated element at least part of the length of which is composed of a plurality of closely coupled conductors disposed in substantially parallel, side-by-side relation to one another, in which the elongated element is a dipole antenna composed of two resistive elements extending in opposite directions from a dipole center at an intermediate location on the elongated element, in which at least one of said resistive elements is constituted by said part of the length of said at least one elongated element and comprises two closely coupled resistances disposed in substantially parallel, side-by-side relation to each other, each said resistance consisting of plural discrete resistors connected in series, the resistors of both resistances being mounted on a single printed circuit board, in which the two closely coupled resistances are twisted about each other and alternate resistors of each series are situated on opposite faces of the printed circuit board, and in which the resistances of the resistors progressively increase with distance from said intermediate location.

13. A field probe according to claim 12, in which each resistor has a pair of terminals spaced from each other, and in which the resistors on each side of the printed circuit board are disposed in a column parallel to the direction of elongation of said elongated element, with the pairs of terminals of the resistors on each side of the printed circuit board situated in parallel lines in oblique relation to the direction of elongation of the elongated element, the resistors of each series being connected to one another by substantially straight conductors extending through the printed circuit board in perpendicular relation to the faces of the printed circuit board.

14. A field probe according to claim 12, in which said one elongated element extends from said intermediate location to an end location whereby two terminals are provided at said end location, one said terminal being at an end of one of said resistances and the other said terminal being at an adjacent end of the other of said resistances, and including processing circuitry and a transmission line having first and second opposite ends, the first end of the transmission line being connected to the processing circuitry and the second end of the transmission line being connected directly to said dipole antenna at said terminals.

15. A field probe according to claim 12, in which said one elongated element extends from said intermediate location to an end location whereby two terminals are provided at said end location, one said terminal being at an end of one of said resistances and the other said terminal being at an adjacent end of the other of said resistances, and including processing circuitry and a transmission line having first and second opposite ends, the first end of the transmission line being connected to the processing circuitry and the second end of the transmission line being connected directly to said dipole antenna at said terminals, in which each resistor has a pair of terminals spaced from each other, and in which the resistors on each side of the printed circuit board are disposed in a column parallel to the direction of elongation of said elongated element, with the pairs of terminals of the resistors on each side of the printed circuit board situated in parallel lines in oblique relation to the direction of elongation of the elongated element, the resistors of each series being connected to one another by substantially straight conductors extending through the printed circuit board in perpendicular relation to the faces of the printed circuit board.

16. A field probe comprising at least one elongated element at least part of the length of which is composed of two closely coupled conductors disposed in substantially parallel, side-by-side relation to each other, in which the closely coupled conductors are twisted about each other, in which said conductors are sufficiently isolated from each other to be capable of a D.C. potential difference between them, and having a feed line connected to both of said conductors, and means, connecting said conductors to each other, for converting an r.f. current in said probe to a D.C. signal in said feed line.

17. A field probe comprising at least one elongated element at least part of the length of which is composed of a plurality of closely coupled conductors disposed in substantially parallel, side-by-side relation to one another, in which the number of closely coupled conductors in the elongated element is two, in which the closely coupled conductors are twisted about each other, and in which each of said closely coupled conductors is composed of a plurality of discrete resistors connected in series.

18. A field probe comprising at least one elongated element at least part of the length of which is composed of a plurality of closely coupled conductors disposed in substantially parallel, side-by-side relation to one another, in which the elongated element is a dipole antenna composed of two conductive elements extending in opposite directions from a dipole center at an intermediate location on the elongated element, and including processing circuitry and a transmission line having first and second opposite ends, the first end of the transmission line being connected to the processing circuitry and the second end of the transmission line being connected directly to said dipole antenna at an end of one of the two conductive elements remote from said central location.

19. A field probe comprising at least one elongated element at least part of the length of which is composed of a plurality of closely coupled conductors disposed in substantially parallel, side-by-side relation to one another, in which the elongated element is a dipole antenna composed of two resistive elements extending in opposite directions from a central location, each resistive element being composed of a plurality of discrete resistors, the resistances of the discrete resistors of each said resistive element increasing with distance from said central location.

20. A field probe comprising at least one elongated element at least part of the length of which is composed of a plurality of closely coupled conductors disposed in substantially parallel, side-by-side relation to one another, in which the elongated element is a dipole antenna composed of two conductive elements extending in opposite directions from a dipole center at an intermediate location on the elongated element, in which at least one of said conductive elements is constituted by said part of the length of said at least one elongated element and comprises two closely coupled conductors disposed in substantially parallel, side-by-side relation to each other and extending from said intermediate location to an end location whereby two terminals are provided at said end location, one said terminal being at an end of one of said conductors and the other said terminal being at an adjacent end of the other of said conductors, and including processing circuitry and a transmission line having first and second opposite ends, the first end of the transmission line being connected to the processing circuitry and the second end of the transmission line being connected directly to said dipole antenna at said terminals.

21. A field probe comprising at least one elongated element at least part of the length of which is composed of a plurality of closely coupled conductors extending, in substantially parallel, side-by-side relation to one another, in the direction of elongation of said elongated element, a feed connected to said closely coupled conductors, and means, connecting said conductors, for converting an r.f. current induced in said conductors by a field in which the probe is situated to a direct current in said feed, in which each of said closely coupled conductors in the elongated element is composed of a plurality of discrete resistors connected in series.

22. A field probe comprising at least one elongated element at least part of the length of which is composed of a plurality of closely coupled conductors disposed in substantially parallel, side-by-side relation to one another, in which the elongated element is a dipole antenna composed of two resistive elements extending in opposite directions from a central location, the resistance of each said resistive element increasing with distance from said central location.

23. A field probe comprising: first and second elements forming a dipole, said elements extending in opposite directions from an intermediate location, each of said first and second elements comprising at least one string of discrete resistors connected in series, and the first element comprising two, substantially parallel, side-by-side strings of discrete resistors extending from said intermediate location to an end of the first element at a location remote from the intermediate location;

a first diode connected electrically in series with one of the strings of the first element and a second diode connected electrically in series with the other of said strings of the first element, a connection, at said intermediate location, between the anode of one of said diodes and the cathode of the other of said diodes, the second element being connected directly to said connection, and the connection being disposed so that the first element is composed of a series of elements consisting of one of said substantially parallel, side-by-side strings of discrete resistors, followed by one of said diodes, followed by said connection, followed by the other of said diodes, and followed by the other of said substantially parallel, side-by-side, strings of discrete resistors; and a transmission line for carrying a signal away from said dipole, the transmission line being connected directly to said two, substantially parallel, side-by-side strings of discrete resistors, at said end of the first element.

24. A field probe according to claim 23, in which said two, substantially parallel, side-by-side strings of discrete resistors are geometrically twisted about each other along an axis.

25. A field probe according to claim 23, in which said two, substantially parallel, side-by-side strings of discrete resistors are geometrically twisted about each other along an axis, and in which the discrete resistors of the first and second elements are mounted on a printed circuit board.

26. A field probe according to claim 23, in which the resistances of the discrete resistors of the first and second elements progressively increase with distance from said intermediate location.

27. A field probe according to claim 23, in which the transmission line is composed of discrete resistors.

28. A field probe according to claim 23, in which the transmission line is composed of discrete resistors, and in which the discrete resistors of the first and second elements and of the transmission line are mounted on a printed circuit board.

29. A field probe comprising:

first and second strings of discrete resistors connected electrically in series, the strings being geometrically twisted about each other along an axis, being in substantially parallel, side-by-side relationship, and extending from a first of the probe to a second end thereof, the first and second ends being located along said axis and being longitudinally separated from each other;

a connection between said strings at a first intermediate location along between said first and second ends;

a first diode connected electrically in series with the first string at said first intermediate location on the side of said connection nearest said first end; and a second diode connected electrically in series with the second string at said first intermediate location on the side of said connection nearest said first end;

the first and second diodes being disposed electrically in the same direction in a series of elements consisting of said connection and the two diodes;

each string of discrete resistors comprising plural discrete resistors between said first end and a second intermediate location along said axis, remote from said first intermediate location and situated between said first end and said first intermediate location, plural discrete resistors between said second and first intermediate locations and plural discrete resistors between said first intermediate location and said second end;

the discrete resistors of each string progressively increasing in resistance with increasing distance from said first intermediate location toward said first end at least to said second intermediate location, and the discrete resistors of each string beyond said second intermediate location to said first end having resistances substantially exceeding the highest resistance of the resistors between said first and second intermediate locations; and the discrete resistors of each string progressively increasing in resistance with increasing distance from said first intermediate location to said second end;

whereby the discrete resistors extending from said first intermediate location to the second intermediate location, and the discrete resistors extending from said first intermediate location to said second end, together serve as a dipole antenna, and the discrete resistors of the first and second strings between said second intermediate and said first end can serve as a transmission line for carrying a signal away from said dipole antenna.

30. A field probe comprising at least one elongated element at least part of the length of which is composed of a plurality of closely coupled conductors extending, in substantially parallel, side-by-side relation to one another, in the direction of elongation of said elongated element, a feed connected to said closely coupled conductors, and means, connecting said conductors, for converting an r.f. current induced in said conductors by a field in which the probe is situated to a direct current in said feed, in which said means connecting said conductors comprises a plurality of diodes connected electrically in series by at least one connection, and having another elongated element connected to said at least one connection, said at least one elongated element and said another elongated element extending in opposite directions to form a dipole.

31. A field probe comprising at least one elongated element at least part of the length of which is composed of a plurality of closely coupled conductors extending, in substantially parallel, side-by-side relation to one another, in the direction of elongation of said elongated element, a feed connected to said closely coupled conductors, and means, connecting said conductors, for converting an r.f. current induced in said conductors by a field in which the probe is situated to a direct current in said feed, in which said feed is connected to said conductors at a location along the length of said conductors remote from said connecting and converting means.

32. A field probe comprising at least one elongated element at least part of the length of which is composed of a plurality of closely coupled conductors extending, in substantially parallel, side-by-side relation to one another, in the direction of elongation of said elongated element, a feed connected to said closely coupled conductors, and means, connecting said conductors, for converting an r.f. current induced in said conductors by a field in which the probe is situated to a direct current in said feed, in which said feed is connected to each of two of said closely coupled conductors, and said connecting and converting means connects one of said two conductors to the other of said two conductors for converting an r.f. current induced in said two conductors to a direct current in said feed, in which said converting means connecting one of said two conductors to the other comprises a pair of diodes connected electrically in series, and in which said another elongated element is connected to a connection between the diodes of said pair.

33. A field probe comprising at least one elongated element at least part of the length of which is composed of a plurality of closely coupled conductors extending, in substantially parallel, side-by-side relation to one another, in the direction of elongation of said elongated element, a feed connected to said closely coupled conductors, and means, connecting said conductors, for converting an r.f. current induced in said conductors by a field in which the probe is situated to a direct current in said feed, in which said feed is connected to each of two of said closely coupled conductors, and said connecting and converting means connects one of said two conductors to the other of said two conductors for converting an r.f. current induced in said two conductors to a direct current in said feed, and in which said feed is connected to each of said two conductors at a location along the length of said conductors remote from said connecting and converting means.

34. A field probe comprising at least one elongated element at least part of the length of which is composed of a plurality of closely coupled conductors extending, in substantially parallel, side-by-side relation to one another, in the direction of elongation of said elongated element, a feed connected to said closely coupled conductors, and means, connecting said conductors, for converting an r.f. current induced in said conductors by a field in which the probe is situated to a direct current in said feed, in which said feed is connected to each of two of said closely coupled conductors, and said connecting and converting means connects one of said two conductors to the other of said two conductors for converting an r.f. current induced in said two conductors to a direct current in said feed, and in which each of said two conductors in the elongated element is composed of a plurality of discrete resistors connected in series.

* * * * *

UNITED STATES PATENT AND TRADEMARK OFFICE
CERTIFICATE OF CORRECTION

PATENT NO.    : 6,593,896 B2                                              Page 1 of 1
DATED         : July 15, 2003
INVENTOR(S)   : Jerome Choder It is certified that error appears in the above-identified patent and that said Letters Patent is hereby corrected as shown below:

<u>Column 1,</u>
Line 42, change "be" to -- to be --;

<u>Column 4,</u>
Line 21, change "cathode" to -- anode --;
Line 23, change "anode" to -- cathode --;
Line 31, delete "is";

<u>Column 6,</u>
Line 45, change "and" to -- to --;

<u>Column 12,</u>
Line 15, change "from a first" to -- from a first end --
Line 20, delete "along".

Signed and Sealed this

Eleventh Day of November, 2003

JAMES E. ROGAN
*Director of the United States Patent and Trademark Office*